United States Patent [19]
Sato

[11] Patent Number: 5,603,444
[45] Date of Patent: Feb. 18, 1997

[54] ULTRASONIC BONDING MACHINE AND RESONATOR THEREOF

[75] Inventor: Shigeru Sato, Fukuoka-ken, Japan

[73] Assignee: Ultex Corporation, Fukuoka-ken, Japan

[21] Appl. No.: 599,803

[22] Filed: Feb. 12, 1996

[30]  Foreign Application Priority Data

Aug. 22, 1995 [JP] Japan .................... 7-213439
Aug. 22, 1995 [JP] Japan .................... 7-213489

[51] Int. Cl.⁶ .......................... B23K 20/10; H01L 21/607
[52] U.S. Cl. ................................. 228/1.1; 228/45
[58] Field of Search .................... 228/110.1, 1.1, 228/45, 44.3, 44.7; 156/73.1, 580.1, 580.2

[56]  References Cited

U.S. PATENT DOCUMENTS

| | | | |
|---|---|---|---|
| 3,038,359 | 6/1962 | Jones et al. | 228/1.1 |
| 3,752,380 | 8/1973 | Shoh | 228/1.1 |
| 3,863,826 | 2/1975 | Shoh | 228/110.1 |
| 4,976,392 | 12/1990 | Smith et al. | 228/1.1 |
| 5,460,315 | 10/1995 | Boltz et al. | 228/1.1 |

*Primary Examiner*—Samuel M. Heinrich
*Attorney, Agent, or Firm*—Wolf, Greenfield & Sacks, P.C.

[57]  ABSTRACT

To provide an ultrasonic bonding machine in which a resonator is arranged horizontally or vertically while it is supported at both ends and a resonator for use in the same. The interface Wa is placed on the mount 13 arranged in a stationary state in a lower portion of the working space 2 open in forward, right and left directions, the resonator 7 is moved down by the pressure mechanism 3 from above, and the interface Wa is pressure-held properly between the bonding working portion 11 and the mount 13 while it is in a stationary state and bonded with vibration energy of a vertical ultrasonic wave. The resonator 7 is assembled by interconnecting the ultrasonic horn having the bonding working portion 11 and two boosters having support portions by means of screws in such a manner that they are coaxial with one another, thereby facilitating exchange of each element. In addition, the resonator can be arranged vertically while it is supported at both ends in the front of the main body.

3 Claims, 10 Drawing Sheets 5,603,444

ULTRASONIC BONDING MACHINE AND RESONATOR THEREOF

BACKGROUND OF THE INVENTION

1. Field of the Invention

This invention relates to an ultrasonic bonding machine for bonding an overlapped interface between a plurality of members to be bonded together with vibration of a vertical ultrasonic wave having a predetermined frequency.

2. Description of the Prior Art

FIG. 14 is a side view of an ultrasonic bonding machine disclosed in Japanese Patent Publication 23349/1979. In FIG. 14, a base 200 includes a hydraulic cylinder 201 like a hydraulic jack constituting a pressure mechanism at the center thereof. On top of a piston rod 202 which projects upward from the top surface of the base 200 of the hydraulic cylinder 201, there is provided a mount 203 for mounting an overlapped interface Wa between members W1 and W2 to be bonded together. A transducer 204 is an so-called electro-acoustic converter or electric vibration converter for converting electric energy into mechanical energy and formed of a piezoelectric element, a magnetostriction element or the like, which generates and outputs vibration of a vertical ultrasonic wave having a predetermined frequency with electric energy received from an unshown ultrasonic wave generator through a cable 205. A bar-shaped resonator 207 is connected mechanically to the output end 206 of this transducer 204 in such a manner that it is coaxial with the transducer 204.

At the maximum vibration amplitude point at the center of the resonator 207, there is provided a bonding working portion 208 which projects outward in a radial direction from the outside surface of the resonator 207. One ends of support members 209 and 210 are connected to the two maximum vibration amplitude points on both sides of the resonator 207, respectively. The other ends of these support members 209 and 210 are connected to the left and right end surfaces of the base 200, respectively. The bottom surface of the bonding working portion 208 and the top surface of the mount 203 are arranged to face each other in a direction perpendicular to the transmission direction of ultrasonic vibration from the transducer 204 to the resonator 207 due to the connection relationship between the resonator 207 and the base 200 by means of the support members 209 and 210.

Therefore, the resonator 207 including the transducer 204 is arranged above the base 200 and parallel to the base 200 by means of the two support members 209 and 210 with a predetermined space formed therebetween. When the piston rod 202 of the hydraulic cylinder 201 stops at the lowermost position, the interface Wa is mounted on the top surface of the mount 203, and the piston rod 202 expands and stops at the uppermost position, the top surface of the interface Wa mounted on the top surface of the mount 203 is pressed against and brought into contact with the bottom surface of the bonding working portion 208 and the bottom surface of the interface Wa is also pressed against and brought into contact with the top surface of the mount 203 during the period from the time when the piston rod 202 moves up from the lowermost position to the time when the piston rod 202 stops at the uppermost position. As the result, the interface Wa is pressure-held between the mount 203 and the bonding working portion 208.

Either after or before the pressure-holding, electric energy is supplied from an unshown ultrasonic wave generator to the transducer 204 to enable the transducer 204 to generate ultrasonic vibration. The ultrasonic vibration generated by the transducer 204 is transmitted to the bonding working portion 208 through the resonator 207 while the interface Wa is pressure-held so as to vibrate the bonding working portion 208 in a direction perpendicular to the direction of pressurization by the hydraulic cylinder 201. After an elapse of time, this vibration causes non-fusion bonding of the overlapped surfaces of the interface Wa, as disclosed in U.S. Pat. No. 2,946,119, for example.

In the above ultrasonic bonding machine of the prior art, since the resonator 207 is attached to the base 200 by means of the support members 209 and 210 formed separately, when the resonator 207 is exchanged with another resonator, it is necessary to disconnect the support member 210 from the resonator 207, remove the support member 210 from the base 200 or move an upper end of the support member 210 on this side or the other side on the paper of FIG. 14, disconnect the resonator 207 from the support member 209, and remove the resonator 207 from the base 200. In this way, the exchange of the resonator is troublesome. Since the interface Wa is pressure-held by lifting the mount 203 by means of the hydraulic cylinder 201, the prior art involves the problem that the interface Wa is held between the bonding working portion 208 and the mount 203 while the interface Wa is horizontally displaced during its upward movement.

One of possible solutions to this problem is that the mount 203 is set still and the resonator 207 is moved vertically while it is arranged horizontally. However, when this resonator 207 is incorporated into a production line, a working space between the resonator 207 and the mount 203 must be widened in a vertical direction due to the relationship between the pre-step and post-step of the bonding step or the relationship between it and the shapes of members W to be bonded together. When a wide working space is formed in the vertical direction, a portion of the machine for housing the pressure mechanism 201 for moving the resonator 207 vertically becomes large in height, thus retrograding from reductions in the size, weight and energy consumption of the entire machine. Therefore, the ultrasonic bonding machine of the prior art is hardly employed.

SUMMARY OF THE INVENTION

A first object of the invention is therefore to provide an ultrasonic bonding machine which facilitates exchange of the resonator and holds the interface properly to improve reliability and a resonator having high practicability such as exchangeability of a worn-out bonding working portion, compatibility with the physical properties of the members to be bonded together and ease of remaking.

A second object of the invention is to provide an ultrasonic bonding machine in which the resonator is arranged vertically at the front of the main body of the machine.

The invention claimed in claim 1 is characterized in that a working space which is open in forward, right and left directions is formed in the main body, a mount is arranged in a lower portion of this working space, a pressure mechanism is installed in an upper inside portion of the main body for defining an upper portion of this working space, a support member is attached to the output end of the pressure mechanism, a resonator is held by the support member at both ends through holding portions on both sides of the bonding working portion in the working space above the mount in such a manner that it is arranged horizontally, the interface is pressure-held between the mount and the bonding working portion of the resonator by moving down the resonator by means of the pressure mechanism in a direction that it approaches the overlapped interface between members to be bonded together placed on the mount, and the overlapped surfaces of the interface are bonded together by transmitting ultrasonic vibration to the bonding working portion of the resonator from the transducer.

According to the constitution claimed in claim 1, when the resonator is to be exchanged with another one, since the resonator is held in an upper portion of the working space in such a manner that it is arranged horizontally by stopping the support member at the uppermost position, the resonator can be easily exchanged from a horizontal direction of the working space. Further, the interface is placed on the mount arranged in a lower portion of the working space and the resonator is moved down by the pressure mechanism from above the interface so that the interface can be bonded with the vibration energy of a vertical ultrasonic wave while it is properly pressure-held in a stationary state between the bonding working portion and the mount.

The invention claimed in claim 2 is characterized in that an overlapped interface between a plurality of members to be bonded together is pressure-held between a bonding working portion of a resonator and a mount by vertically moving a pressure mechanism provided inside a main body, ultrasonic vibration is transmitted from a transducer to the resonator to bond the interface, a cross-shaped vibration converter is provided at the minimum vibration amplitude point of ultrasonic vibration transmitted from the transducer to the resonator, the bonding working portion is provided at an end portion in a horizontal direction of the cross of the vibration converter, the resonator is held at both ends by a holding member through support portions thereof in such a manner that it is arranged vertically at the front of the main body, a plurality of guide members are provided on the front surface of the main body in such a manner that they are arranged in parallel to each other in a horizontal direction with a predetermined space formed therebetween, and members to be guided which slide along these guide members are provided on the rear surface of the holding member.

According to the constitution claimed in claim 2, the size, weight and energy consumption of the main body can be reduced by providing the resonator at the front of the main body in such a manner that it is arranged vertically and parallel to the vertical movement direction of the pressure mechanism. In addition, reaction force received by the holder at the time of pressure-holding is born by the front wall of the main body through the guide mechanism, thereby ensuring parallelism between the bottom surface of the bonding working portion and the top surface of the mount to stabilize the bonding strength of the interface.

The invention claimed in claim 3 is a resonator used in an ultrasonic bonding machine which is characterized in that two boosters having support portions are connected to both ends of an ultrasonic horn having bonding working portions with screws in such a manner that they are coaxial with the ultrasonic horn.

According to the constitution claimed in claim 3, it is possible to replace the ultrasonic horn only and not the entire resonator when the bonding working portions of the ultrasonic horn are worn out, to select from a variety of ultrasonic horns one the most suitable for the physical properties such as the area and thickness of the interface and the materials of the members to be bonded together and use the selected one, and to remake an ultrasonic horn or a booster only even when the component is different in size from a design drawing in the process of production.

The above and other objectives, features and advantages of the invention will become more apparent from the following description when taken in conjunction with the accompanying drawings.

DESCRIPTION OF THE PREFERRED EMBODIMENT

Figure 1:
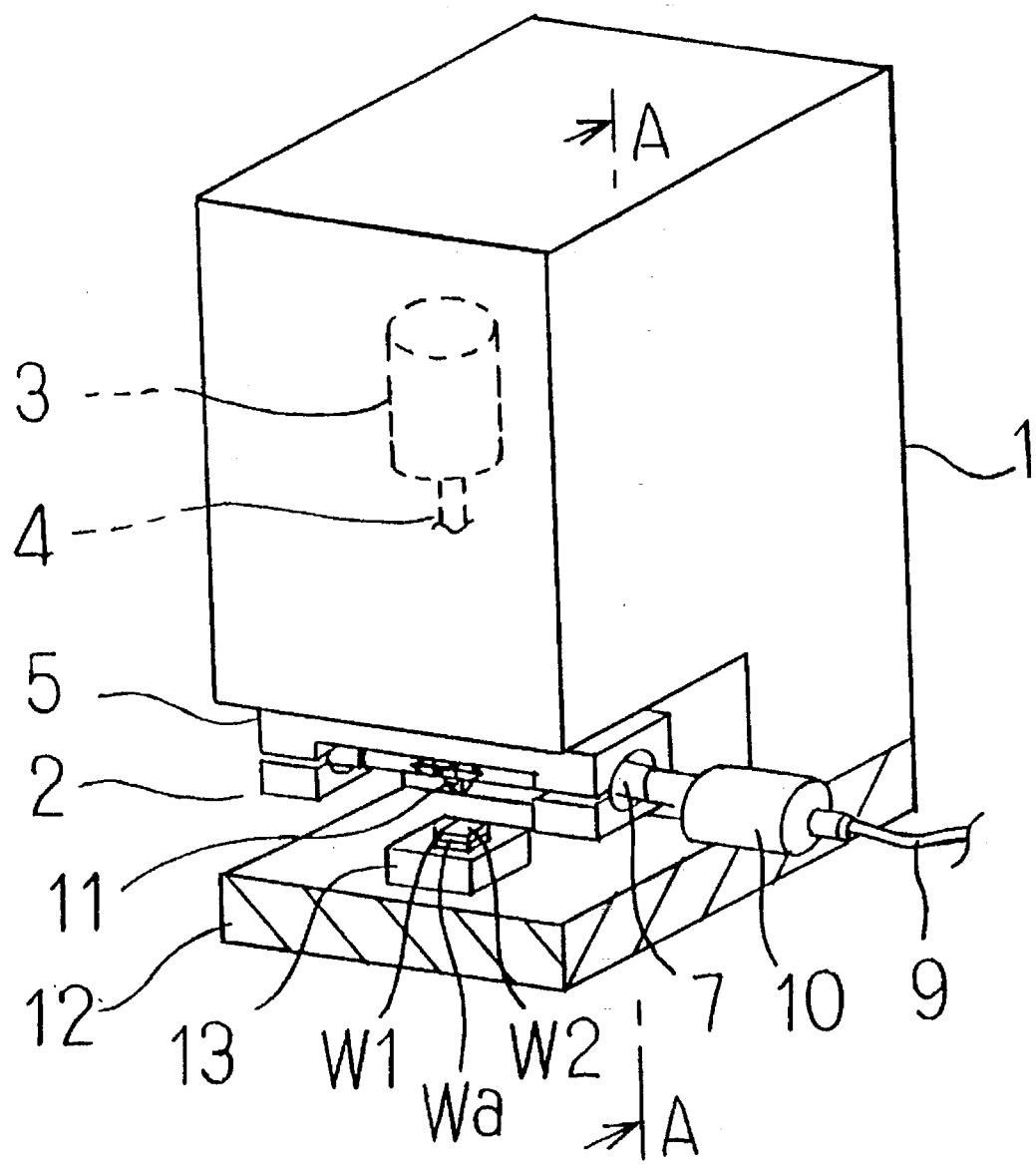
FIG. 1 is a perspective view of an ultrasonic bonding machine according to Embodiment 1 of the present invention.
Figure 2:
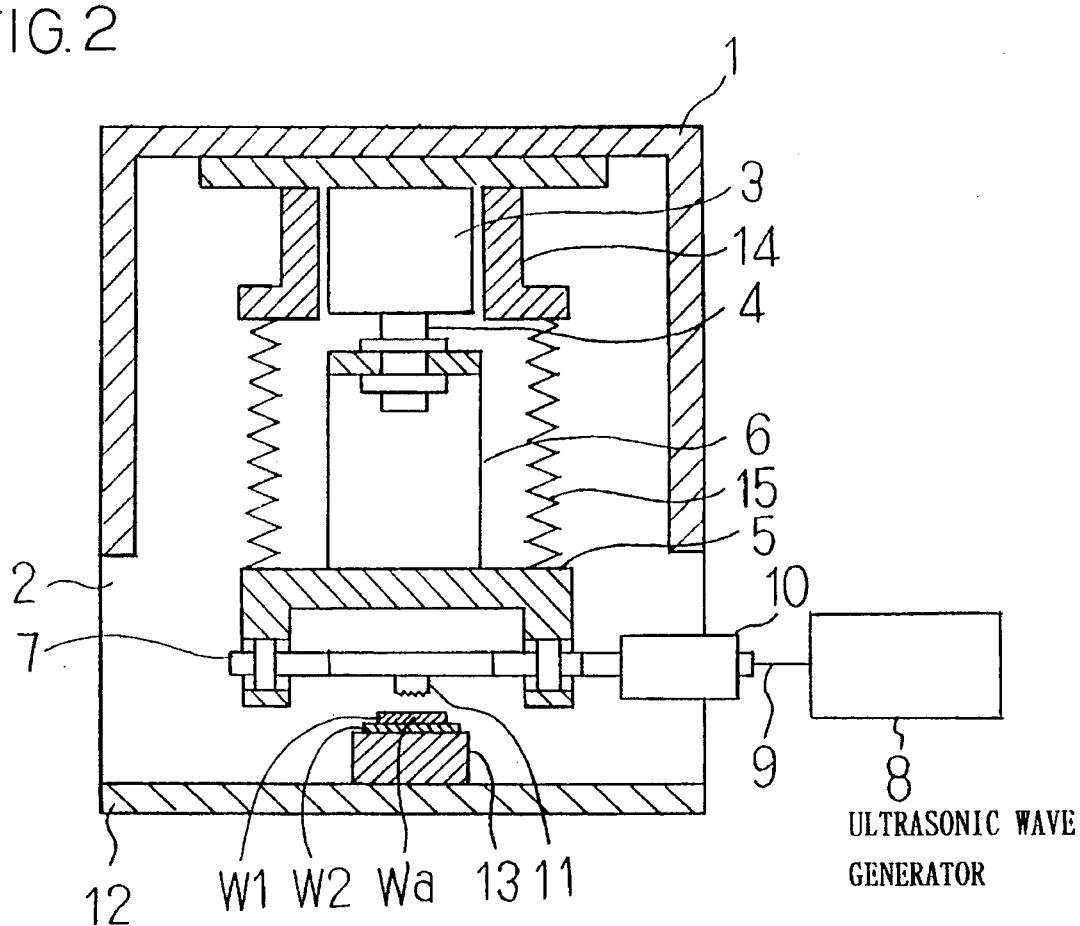
FIG. 2 is a sectional view taken on line A—A of FIG. 1.

FIG. 1 is a perspective view of an ultrasonic bonding machine in which a resonator is arranged horizontally, and FIG. 2 is a sectional view taken on line A—A of FIG. 1. In these FIGS. 1 and 2, a working space 2 which is open in forward, right and left directions is formed in a lower front portion of a main body 1. An air cylinder 3 as a pressure mechanism is installed in an upper inside portion of the main body 1 for defining an upper part of the working space 2. A support member 5 is connected through a connection member 6 (see FIG. 2) to a lower end of a piston rod 4 which protrudes below the air cylinder 3.

The support member 5 holds a bar-shaped resonator 7 made of an alloy such as a titanium alloy having good acoustic characteristics in such a manner that it is arranged horizontally in an upper inside portion of the working space 2 and supported at both ends thereof. To one end of the resonator 7 is connected mechanically the output end of a transducer 10 as an electric vibration converter for generating and outputting vibration of a vertical ultrasonic wave having a predetermined frequency with electric energy received from an ultrasonic wave generator 8 (see FIG. 2) through a cable 9 (see FIG. 2) in such a manner that the resonator 7 is coaxial with the transducer 10. The resonator 7 has bonding working portions 11 which project at the center of the resonator 7 in an axial direction and resonates with ultrasonic vibration transmitted from the transducer 10 and with a predetermined frequency.

A lower portion of the main body 1 for defining a rear portion of the working space 2 is located above a bed 12 constituting a base for incorporating an ultrasonic bonding machine in a production line, for example. A mount 13 for mounting an overlapped interface Wa between a plurality of members W1 and W2 to be bonded together is installed on top of the bed 12 for defining a lower portion of the working space 2. The mount 13 is arranged in a lower inside portion of the working space 2 in such a manner that it is coaxial with the piston rod 4 and the bonding working portion 11 in a vertical direction so that a top surface of the mount 13 faces a bottom surface of the bonding working portion 11 in parallel to the surface with a predetermined space formed therebetween when the piston rod 4 stops at the uppermost position.

As shown in FIG. 2, the main body 1 has therein a pair of right and left spring seats 14 on both sides of the air cylinder 3. To these spring seats 14 are fixed one ends of elastic members 15 such as coil springs. The other ends of these elastic members 15 are fixed to the support member 5. The elastic members 15 provide upward elastic force to the support member 5. Particularly when pressure air for lifting is not supplied from an unshown pressure air feed circuit to the air cylinder 3, the above elastic force prevents the support member 5 from falling by its weight and holds the support member 5 at the uppermost position.

Figure 3:
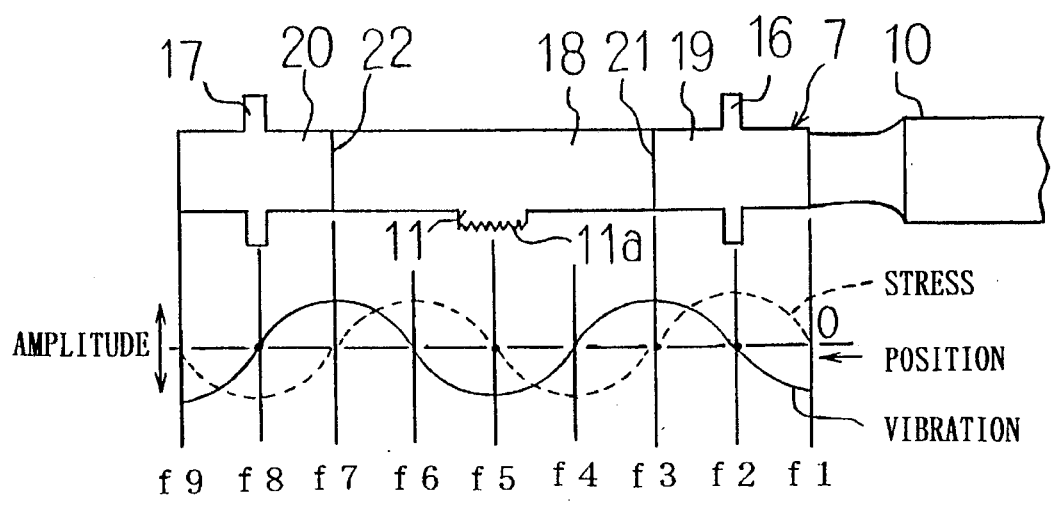
FIG. 3 is a schematic diagram showing the positional relationship among the transducer, the resonator, ultrasonic vibration and stress of Embodiment 1.

FIG. 3 is a schematic diagram showing the positional relationship among the transducer, the resonator, ultrasonic vibration and stress. In this FIG. 3, the resonator 7 is sized to provide five maximum vibration amplitude points f1, f3, f5, f7 and f9, and four minimum vibration amplitude points f2, f4, f6 and f8 at intermediate positions between the respective maximum vibration amplitude points when it resonates with ultrasonic vibration transmitted from the transducer 10 as a vertical wave. That is, the total length of the resonator 7 is set to be equal to two times the wavelength of a resonance frequency. Instantaneous displacement of the ultrasonic vibration generated by the resonator 7 is indicated by a waveform drawn by a solid line. Displacement of stress generated inside the resonator 7 by the displacement of the ultrasonic vibration is indicated by a waveform drawn by a dotted line. It has already been elucidated by the theory of ultrasonic wave that the relationship between the displacement of the stress and the displacement of the ultrasonic vibration is such that the maximum vibration amplitude points f1, f3, f5, f7 and f9 become the minimum stress points and the minimum vibration amplitude points f2, f4, f6 and f8 become the maximum stress points.

In the case of this Embodiment, the resonator 7 has bonding working portions 11 at the maximum vibration amplitude point f5 located at the center thereof in the transmission direction of ultrasonic vibration from the transducer 10 to the resonator 7. The bottom surface 11a of each of the bonding working portions 11 is reticulated, vertically grooved, horizontally grooved or smoothened in accordance with the material of the member W1 to be bonded so as to ensure contact-holding of the interface Wa. Therefore, when the interface Wa is pressed by the bonding working portion 11 and the mount 13, it is properly held without causing horizontal displacement of the overlapped position of the interface Wa. The above resonator 7 has a support protrusion 16 at the minimum vibration amplitude point f2 which is the closest to the transducer 10 from the maximum vibration amplitude point f5 and a support protrusion 17 at the minimum vibration amplitude point f8 which is the farthest from the maximum vibration amplitude point f5 to the transducer 10.

The resonator 7 consists of an ultrasonic horn 18 at the center thereof and two boosters 19 and 20 connected mechanically to both ends of the ultrasonic horn 18 in such a manner that they are coaxial with the ultrasonic horn 18. This ultrasonic horn 18 has a length from the maximum vibration amplitude point f3 to the maximum vibration amplitude point f7 which is equal to one wavelength and the bonding working portion 11 is provided coaxially with the ultrasonic horn 18 at the center thereof in such a manner that it is positioned at the maximum vibration amplitude point f5 and projects outward in a radial direction from the outside surface of the ultrasonic horn 18. The booster 19, one of the two boosters 19 and 20, has a length from the maximum vibration amplitude point f1 to the maximum vibration amplitude point f3 which is equal to half the wavelength, and the other booster 20 has a length from the maximum vibration amplitude point f7 to the maximum vibration amplitude point f9 which is equal to half the wavelength. Connection surfaces 21 and 22 of these boosters 19 and 20 with the ultrasonic horn 18 are located at the maximum vibration amplitude points f3 and f7, respectively. At the centers of the boosters 19 and 20, support protrusions 16 and 17 are provided coaxially with these boosters 19 and 20, respectively, in such a manner that they project outward in a radial direction from the outside surfaces of the boosters 19 and 20 and are located at the minimum vibration amplitude points f2 and f8, respectively.

Figure 4:
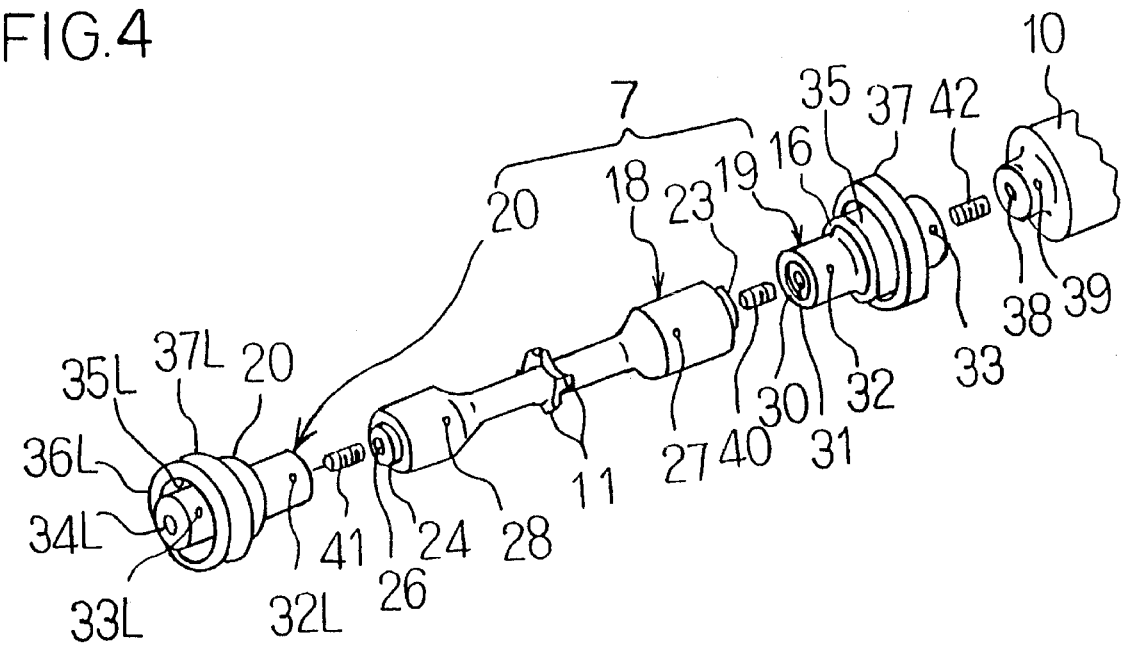
FIG. 4 is an exploded perspective view of the transducer and the resonator of Embodiment 1.

FIG. 4 is an exploded perspective view of the transducer and the resonator. In this FIG. 4, mating protrusions 23 and 24 are formed on both end surfaces in an axial direction of the ultrasonic horn 18 in such a manner that they are shaped like short cylinders having an outer diameter smaller than the outer diameter of the end surface of the ultrasonic horn 18 and project coaxially with the ultrasonic horn 18, screw holes 25 (see FIG. 8) and 26 are formed inward in an axial direction at the centers of the end surfaces of these mating protrusions 18 and 19, respectively, and tool holes 27 and 28 are formed inward in a radial direction on the outside surfaces of the boosters 19 and 20, respectively. A plurality, for example, 4 of the bonding working portion 11 provided on the resonator 7 are arranged at equal intervals in a circumferential direction on the outside surface of the resonator 7.

Since the above two boosters 19 and 20 are of the same structure and laterally symmetrical to reduce production costs and facilitate tuning of vibration distribution, only the booster 19 shown on the right side in FIG. 4 is described hereinunder. A mating recessed portion 30 is formed on one end surface in an axial direction of the booster 19 as a circular hole coaxial with the booster 19 and having an inner diameter smaller than the outer diameter of the end surface, a screw hole 31 is formed inward in an axial direction at the center of the bottom surface of the mating recessed portion 30, tool holes 32 and 33 are formed inward in a radial direction on the outside surface of the booster 19, and a screw hole 34 (see FIG. 8) is formed inward in an axial direction at the center of the end surface of the booster 19.

Figure 8:
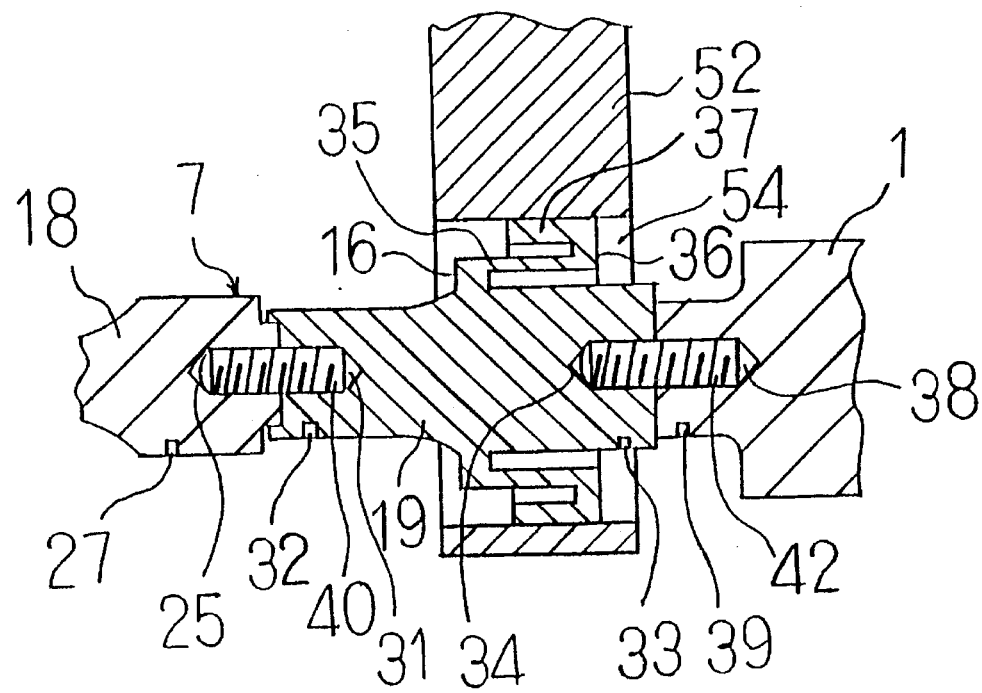
FIG. 8 is a sectional view of the resonator installed in the holding portion, taken on line D—D of FIG. 5.

The above support protrusion 16 provided on the booster 19 is formed like a ring wall which projects outward in a radial direction from the outside surface of the booster 19. This support protrusion 16 is coaxial with the booster 19. A buffer cylinder 35 having an inner diameter larger than the outer diameter of the booster 19 is provided around and connected to the support protrusion 16 as shown in FIG. 8. The buffer cylinder 35 is coaxial with the booster 19 and surrounds the outside surface of the booster 19 in such a manner that engagement of an unshown fastening tool with the tool hole 33 is not interfered and a space is present between it and the outside surface of the booster 19. A ring-shaped connection wall 36 which projects outward in a radial direction is connected to an end portion of the buffer cylinder 35 opposite to the support protrusion 16. This ring-shaped connection wall 36 is coaxial with the booster 19. A ring-shaped flange 37 halving an inner diameter larger than the outer diameter of the buffer cylinder 35 is connected to the outside surface of this ring-shaped connection wall 36. This flange 37 is coaxial with the booster 19 and surrounds the outside surface of the buffer cylinder 35 in such a manner that a space is present between it and the outside surface of the buffer cylinder 35.

Back to FIG. 4, the mating recessed portion, screw holes, tool holes, buffer cylinder, ring-shaped connection wall and flange of the booster 20 shown on the left side are indicated by the same reference numerals as those for the mating recessed portion 30, screw holes 31 and 34, tool holes 32 and 33, buffer cylinder 35, ring-shaped connection wall 36 and flange 37 of the booster 19 and an English letter "L". The thicknesses of the buffer cylinders 35 and 35L are smaller than the thicknesses of the support protrusions 16 and 17, the ring-shaped connection walls 36 and 36L, and the flanges 37 and 37L.

In FIG. 4, reference numeral 38 represents a screw hole formed inward in an axial direction from the center of the end surface of the output end of the transducer 10, 39 a tool hole formed inward in a radial direction from the outside surface of the output end of the transducer 10, 40 a headless bolt for connecting the ultrasonic horn 18 and the booster 19, 41 a headless bolt for connecting the ultrasonic horn 18 and the booster 20, and 42 a headless bolt for connecting the booster 19 and the output end of the transducer 10. Each of these headless bolts 40 to 42 includes on its rear end surface a tool hole for accepting a top end of an unshown fastening tool having a hexagonal cross section inscribed therein, such as a hexagonal wrench.

As shown in FIG. 8, the above ultrasonic horn 18 and the booster 19 are mechanically interconnected by means of the headless bolt 40. In concrete terms, a fastening tool inserted into an unshown tool hole for the headless bolt 40 is used to fit a top end portion of the headless bolt 40 firmly into the screw hole 25 of the ultrasonic horn 18. Thereafter, the fastening tool is pulled out of the tool hole for the headless bolt 40, and a rear end portion of the headless bolt 40 projecting outward in an axial direction from the ultrasonic horn 18 is fit into the screw hole 31 of the booster 19. Further, another unshown fastening tool other than the above fastening tool is inserted into the tool hole 27 of the ultrasonic horn 18 and another fastening tool is inserted into the tool hole 32 of the booster 19. The booster 19 is rotated in one circumferential direction by means of the fastening tool while the ultrasonic horn 18 is held not to rotate by the fastening tool, for example, under the above condition in order to fit the rear end portion of the headless bolt 40 firmly into the screw hole 31 of the booster 19.

With this connection operation, the mating protrusion 23 of the ultrasonic horn 18 perfectly fits in the mating recessed portion 30 of the booster 19 so that an extremely small gap between the headless bolt 40 and the screw hole 31 is eliminated, the ultrasonic horn 18 and the booster 19 are interconnected coaxial with each other as an inseparable unit, and ultrasonic vibration is properly transmitted between the ultrasonic horn 18 and the booster 19.

In short, when the ultrasonic horn 18 and the booster 19 are interconnected by means of the headless bolt 40, the ultrasonic horn 18 and the booster 19 are interconnected coaxial with each other accurately by engaging the mating recessed portion 30 with the mating protrusion 23 while they are aligned with each other so that the end surfaces of the mating recessed portion 30 and the mating protrusion 23 are pressed against and brought in contact with each other, resulting in efficient transmission of ultrasonic vibration.

Referring to FIG. 8, it is easily understood how to interconnect the ultrasonic horn 18 and the booster 20 shown in FIG. 4 into an inseparable unit by means of the headless bolt 41 and how to interconnect the booster 19 and the output end of the transducer 10 by means of the headless bolt 42.

According to the resonator 7 shown in FIG. 4, since the ultrasonic horn 18, the boosters 19 and 20, and the transducer 10 are provided with tool holes 27, 28, 32, 32L, 33, 33L and 39, respectively, interconnections of the ultrasonic horn 18, the boosters 19 and 20, and the transducer 10 by means of the headless bolts 40 to 42, disconnection of these elements, and re-assembly can be carried out properly and easily. Moreover, damage such as scratches and turn-ups can be prevented from being produced by a fastening tool on the outside surfaces of the ultrasonic horn 18, the boosters 19 and 20, and the transducer 10, thereby making it possible to carry out accurate tuning of vibration distribution and resonance frequency. In other words, when a scratch or turn-up is produced on the resonator 7, the weight balance of the entire resonator 7 is lost, resulting in inaccurate tuning of vibration distribution and resonance frequency.

Figure 5:
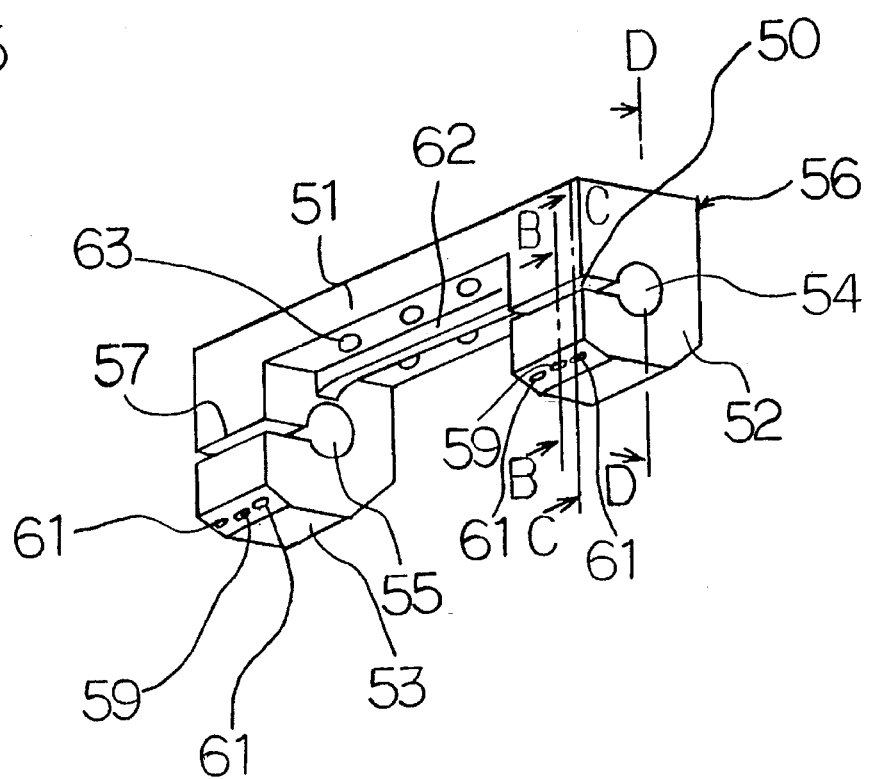
FIG. 5 is a perspective view of the support member of Embodiment 1.
Figure 6:
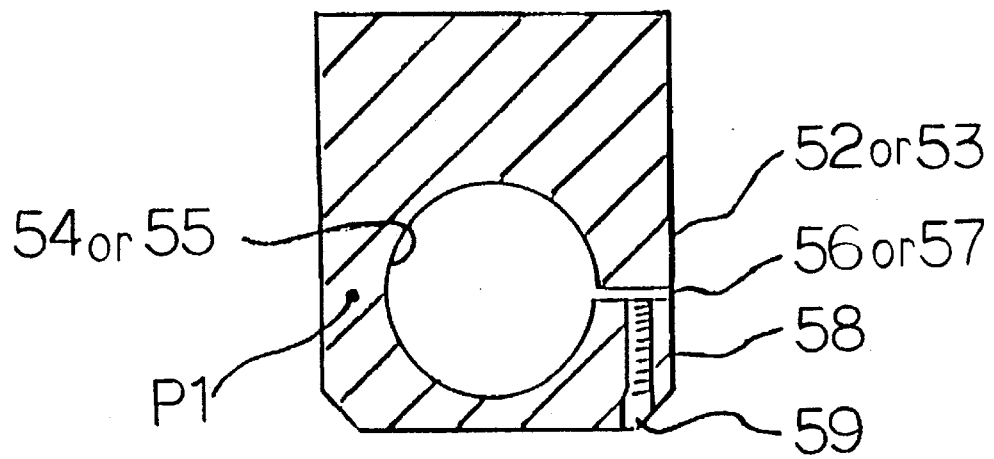
FIG. 6 is a sectional view taken on line B—B of FIG. 5.

FIG. 5 is a perspective view of the afore-mentioned support member. In this FIG. 5, the support member 5 consists of a base plate portion 51 and a pair of holding portions 52 and 53 which project downward from both right and left ends of the base plate portion 51. Through holes 54 and 55 for accepting the resonator 7 including the transducer 10 are formed in these holding portions 52 and 53 in such a manner that they are coaxial with each other in a horizontal direction. The diameters of these through holes 54 and 55 can be varied by expanding slots 56 and 57 formed in the surrounding walls of the through holes 54 and 55. Below the expanding slots 56 and 57, screw holes 58 are formed in the holding portions 52 and 53 with the centers thereof disposed in a vertical direction as shown in FIG. 6. Top ends of the screw holes 58 are connected to the expanding slots 56 and 57. Counter bores 59 are formed below the screw holes 58 by counterboring the holding portions 52 and 53 upward from their bottom surfaces. Therefore, unshown screws are screwed into the screw holes 58 from the counter bores 59 and top end portions of the screws projecting upward from the screw holes 58 press up the surfaces of the holding portions 52 and 53 above the expanding slots 56 and 57. As a counteraction against this, lower parts of the holding portions 52 and 53 below the expanding slots 56 and 57 are urged downward with portions P1 facing the expanding slots 56 and 57 and located on the left side of the slots 56 and 57 serving as the centers of the holding portions 52 and 53. As the result, the diameters of the through holes 54 and 55 increase.

Figure 7:
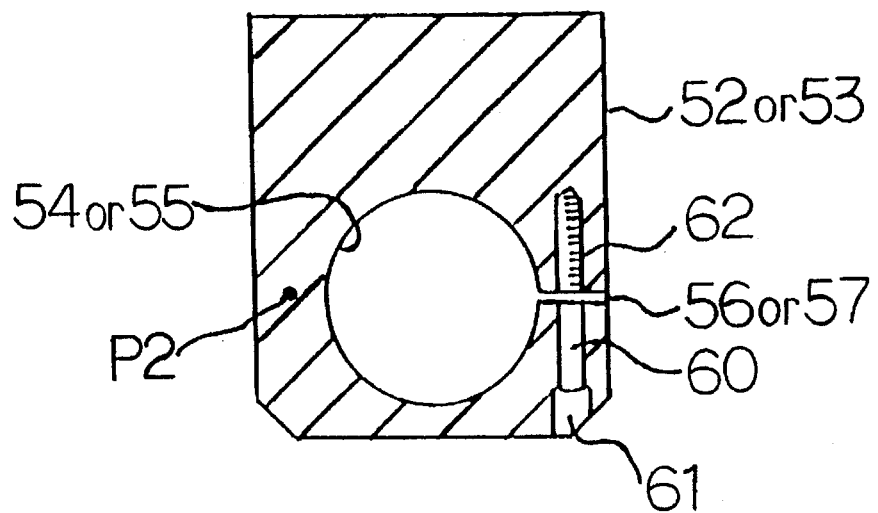
FIG. 7 is a sectional view taken on line C—C of FIG. 5.

On the right and left sides of the above counter bores 59 of FIG. 5, holes 60 for introducing a screw are formed in the holding portions 52 and 53 with the centers thereof disposed in a vertical direction as shown in FIG. 7. Top ends of the holes 60 are connected to the expanding slots 56 and 57. Counter bores 61 are formed below the holes 60 by counterboring the holding portions 52 and 53 upward from their bottom surfaces. Screw holes 62 are formed in the holding portions 52 and 53 coaxially with the holes 60 at positions facing the holes 60. Therefore, when unshown bolts with a head are screwed into the screw holes 62 through the holes 60 from the counter bores 61, parts of the holding portions 52 and 53 around the holes 60 are urged upward with portions P2 (identical to P1 of FIG. 6) facing the expanding slots 56 and 57 and located on the left side of the expanding slots 56 and 57 serving as the centers of the holding portions 52 and 53. As the result, the diameters of the through holes 54 and 55 decrease and it is possible to hold the flanges 37 and 37L of the resonator 7 coaxial with each other in the through holes 54 and 55 without unbalanced weighting.

In other words, in this Embodiment, to attach the assembly of the resonator 7 and the transducer 10 to the support member 5, the diameters of the through holes 54 and 55 are made slightly larger than the outer diameter of the flange 37 (see FIG. 8) of the resonator 7 by the above structure of FIG. 6. Under this condition, the booster 20, which is the left element of the resonator 7 and the head of the assembly, is inserted into the through hole 54 of the right holding portion 52 and then into the through hole 55 of the left holding portion 53, and the booster 19, the right element of the resonator 7, is inserted into the through hole 54 of the right holding portion 52. Thereafter, the unshown screws screwed into the screw holes 58 of FIG. 6 are screwed back so that the top ends of the screws are separated from the surfaces of the holding portions 52 and 53 above the expanding slots 56 and 57 to reduce the diameters of the through holes 54 and 55 by the above structure of FIG. 7, and the inside surfaces of the through holes 54 and 55 are brought into contact with the outside surfaces of the flanges 37. Subsequently, when unshown screws with a head are screwed into the screw holes 62 shown in FIG. 7 through the counter bores 61 and the holes 60 for introducing a screw, the flanges 37 and 37L are held by the holding portions 52 and 53 and the above assembly of the resonator 7 and the transducer 10 is installed in the support member 5 in such a manner that the assembly sits astride the right and left holding portions 52 and 53.

Back to FIG. 5, the base plate portion 51 comprises a beam 62 connected to the holding portions 52 and 53 and through holes 63 for connecting the support member 5 to the connection member 6 (see FIG. 2) by means of unshown bolts with a head.

Meanwhile, the ultrasonic horn 18 and the boosters 19 and 20 are shaped to match the resonator 7 with a resonance frequency which is determined by the frequency of ultrasonic vibration transmitted from the ultrasonic wave generator 8 to the transducer 10. In this Embodiment, the ultrasonic horn 18 is shaped to have a length equal to the wavelength of the resonance frequency, and the boosters 19 and 20 are shaped to have a length to half the wavelength of the resonance frequency so as to tune the resonator 7.

A description is subsequently given of the operation of this Embodiment shown in FIGS. 1 to 8. Due to the air feed route shifting operation of the unshown pressure air feed circuit, as shown in FIGS. 1 and 2, the piston rod 4 of the air cylinder 3 is activated to contract and the bonding working portion 11 is moved upward and apart from the mount 13 a predetermined distance in a direction perpendicular to the transmission direction of ultrasonic vibration from the transducer 10 to the resonator 7. Thereafter, the piston rod 4 stops contraction and the bonding working portion 11 stops at the uppermost position, whereby a predetermined space for taking in and out the overlapped interface Wa between a plurality of members W1 and W2 to be bonded together is formed between the bottom surface of the bonding working portion 11 and the top surface of the mount 13. When the bonding working portion 11 stops at the uppermost position, the plurality of members W1 and W2 to be bonded together are placed in the bonding working area on the top surface of the mount 13 while they overlap each other.

Subsequently, during the period from the time when the piston rod 4 is activated to expand against the elastic force of the elastic member 15 to the time when it stops at the lowermost position by the air feed route shifting operation of the pressure air feed circuit, the top surface of the interface Wa placed on top of the mount 13 is pressed against and brought in contact with the bottom surface of the bonding working portion 11 of the resonator 7, and the bottom surface of the interface Wa is pressed against and brought into contact with the top surface of the mount 13. As the result, the interface Wa is pressure-held between the mount 13 and the bonding working portion 11.

Either after or before the interface Wa is pressure-held, high-frequency energy is supplied from the ultrasonic wave generator 8 to the transducer 10 to cause the transducer 10 to generate ultrasonic vibration. The resonator 7 resonates with this ultrasonic vibration and the bonding working portion 11 vibrates with the maximum vibration amplitude in a direction perpendicular to the direction of pressurization by the air cylinder 3 to non-fusion bond the overlapped surfaces of the interface Wa.

According to this Embodiment, since the support protrusions 16 and 17 are provided at the minimum vibration amplitude points f2 and f8 on both sides of the bonding working portion 11, part of ultrasonic vibration energy to be transmitted from the transducer 10 to the bonding working portion 11 of the resonator 7 is transmitted from the transducer 10 to the bonding working portion 11 efficiently without being consumed by the support protrusions 16 and 17. Therefore, bonding strength of the bonding working portion 11 does not fluctuate and becomes stable, and the incidence of bonding failure significantly decreases.

In addition, as shown in FIG. 8, the ring-shaped flange 37 connected to the support protrusion 16 through the buffer cylinder 35 and the ring-shaped connection wall 36 is inserted in the through hole 54 and connected to the holding portion 52. Therefore, the resonator 7 is mechanically attached to the holding portion 52 in such a manner that it is kept afloat by the holding portion 52. As the result, ultrasonic vibration energy transmitted from the transducer 10 to the booster 19 of the resonator 7 is further transmitted from the booster 19 to the ultrasonic horn 18 efficiently without being consumed by the support protrusion 16, the buffer cylinder 35 and the ring-shaped connection wall 36.

Finally, after the pressure-holding of the interface Wa by means of the bonding working portion 11 and the mount 13 is released, the top surface of the mount 13 and the bottom surface 11a of the bonding working portion 11 parts instantaneously from the interface Wa which has been bonded, and the plurality of members W1 and W2 which have been bonded together through the interface Wa are taken out from a predetermined space formed between the mount 13 and the bonding working portion 11 to complete the bonding step.

Meanwhile, according to this Embodiment, since the working space 2 is open in a horizontal direction, to exchange the resonator 7 with another resonator, when the air cylinder 3 is activated to contract, the support member 5 stops at the uppermost position, and the resonator 7 is arranged in a horizontal direction in an upper portion of the working space 2 as shown in FIG. 1, the resonator 7 can be removed from the support member 5 by increasing the diameters of the right and left through holes 54 and 55 (see FIG. 5) of the support member 5, holding the transducer 10 and pulling it out sideways. Thereafter, the resonator 7 is removed from the transducer 10, another resonator is connected to the transducer 10 by means of the headless bolt 42 (see FIG. 4), and the resonator connected to the transducer 10 is inserted into the support member from a horizontal direction as described above so that it is arranged horizontally, thereby making it easy to exchange the resonator 7.

Further, according to this Embodiment, as shown in FIG. 4, since the resonator 7 has a plurality of bonding working portions 11 on its outside surface, the bottom surfaces 11a of the plurality of bonding working portions 11 are made different, for example, one of the bottom surfaces 11a is reticulated, another bottom surface 11a vertically grooved, another bottom surface 11a horizontally grooved, and another bottom surface 11a smoothened, so that, even when a plurality of members W1 and W2 to be bonded together are made of different materials, a plurality of bonding operations can be properly performed with a single ultrasonic bonding machine by rotating the resonator 7 including the transducer 10 in a circumferential direction with respect to the support member 5 to cause the bonding working portion 11 suitable for the different material to be bonded to face the mount 13 so as to bond the different materials. Further, when the bottom surfaces 11a of the plurality of the bonding working portions 11 are of the same form, the number of bonding operations to be performed with a single resonator 7 can be increased to several times by using another bonding working portion 11 when one of the bonding working portions 11 is worn out.

The ultrasonic horn 18 which has a length equal to the wavelength of the resonance frequency has been illustrated in the above Embodiment. When an ultrasonic horn having a length equal to multiples, for example, two, three, four or five times, of the wavelength of the resonance frequency is used, ease of bonding work can be ensured even if the members W1 and W2 to be bonded together are long. In any case, it is necessary to position the connection surfaces 21 and 22 between the ultrasonic horn 18 and the boosters 19 and 20 at maximum vibration amplitude points at which stress becomes null and to position the support protrusions 16 and 17 as support points of the boosters 19 and 20 at minimum vibration amplitude points.

The ultrasonic horn 18 which is round bar-shaped is shown in the above Embodiment, but may be square bar-shaped, for example, with a plurality of bonding working portions on the top and bottom surfaces thereof so as to adapt the bottom surface 11a of the bonding working portion to physical properties such as the area and thickness of the interface and the material of the members to be bonded together. An ultrasonic horn the most suitable for the physical properties such as shape and material of the members to be bonded together is selected from a variety of ultrasonic horns.

Figure 9:
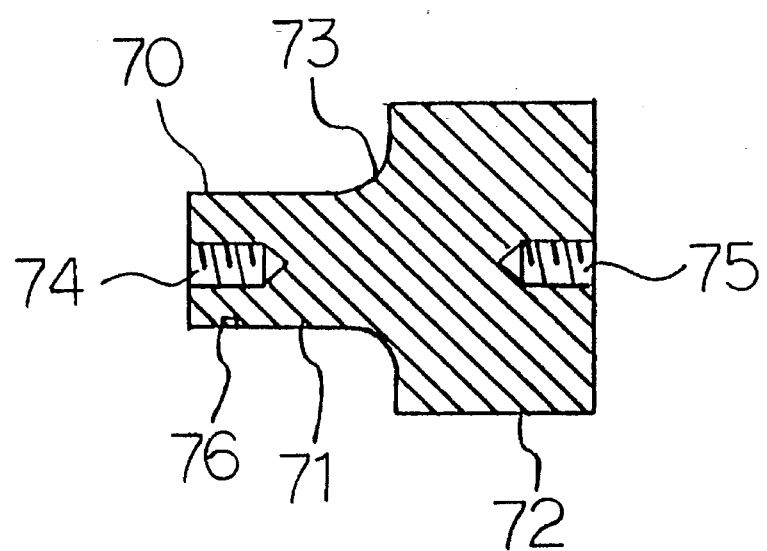
FIG. 9 is a vertical sectional view of the intermediate booster of Embodiment 1.

In the above Embodiment, the resonator 7 is connected to the output end of the transducer 10. However, it is possible to change the vibration amplitude at the bonding working portion 11 by using a bar-shaped intermediate booster made of a material selected from titanium, aluminum or hardened iron, for example, and having a length equal to multiples of a half of the wavelength between the resonator 7 and the transducer 10. The intermediate booster is described with reference to FIG. 9. In this FIG. 9, the intermediate booster 70 has a length equal to half the wavelength, and consists of a half portion equal to ¼ of the wavelength as a small-diameter portion 71, the other half portion as a large-diameter portion 72, and a connection portion 73 for connecting the large-diameter portion 72 and the small-diameter portion 71, which has a circular arc section to moderate the concentration of stress and is smoothly connected to the large-diameter portion 72 and the small-diameter portion 71. This connection portion 73 is formed on all the areas in a circumferential direction of the large-diameter portion 72 and the small-diameter portion 71. Screw holes 74 and 75 are formed inward in an axial direction at the centers of both end surfaces of the intermediate booster 70 and a tool hole 76 is formed inward in a radial direction on the outside surface of the intermediate booster 70. Since the intermediate booster 70 is structured such that the input/output ratio (magnification) of vibration amplitude is changed by the volume ratio of the large-diameter portion 72 to the small-diameter portion 71, when the diameters of the large-diameter portion 72 and the small-diameter portion 71 are set such that the volume of the large-diameter portion 72 becomes double that of the small-diameter portion 71, for example, the transducer 10 is removed from the booster 19 of the resonator 7 while the headless bolt 42 shown in FIG. 8 remains in the booster 19, the large-diameter portion 72 is connected to the output end of the transducer 10 through screw holes 75 and 38 by using an unshown screw corresponding to the headless bolt 42, and the small-diameter portion 71 is connected to the booster 19 through screw holes 74 and 34 by using a rear end portion of the headless bolt 42 which projects from the booster 19, vibration amplitude at the bonding working portion 11 of the resonator when the intermediate booster 70 is used is double that when the intermediate booster 70 is not used. When the transducer 10 is removed from the booster 19 of the resonator 7 while the headless bolt 42 shown in FIG. 8 remains in the booster 19, the small-diameter portion 71 is connected to the output end of the transducer 10 through the screw holes 74 and 38 by using the unshown screw corresponding to the headless bolt 42, and the large-diameter portion 72 is connected to the booster 19 through the screw holes 75 and 34 by using an rear end portion of the headless bolt 42 which projects from the booster 19, vibration amplitude at the bonding working portion 11 of the resonator when the intermediate booster 70 is used is half that when the intermediate booster 70 is not used. In this way, since the working space 2 in the main body 1 is open in a horizontal direction as shown in FIG. 1 even when the intermediate booster 70 is used, the intermediate booster 70 can be attached to the resonator 7 while the resonator 7 is fit in the support member 5.

In the above Embodiment, the resonator 7 having the bonding working portions 11 at the maximum vibration amplitude point f5 is used. However, the present invention is not limited to this. Not illustrated, but another embodiment is possible in which the minimum vibration amplitude point is arranged at the center of the ultrasonic horn, a cross-shaped vibration converter is provided around the minimum vibration amplitude point, the bonding working portion is provided on the cross-shaped flat surface of the vibration converter, the vibration converter changes the transmission direction of ultrasonic vibration into a straight direction and a direction perpendicular to the straight direction, the resonator using vibration energy obtained by combining ultrasonic vibration in the straight direction and ultrasonic vibration in its perpendicular direction is held at both ends by the support member 5 on the side of the main body 1 through the support protrusions 16 and 17 in such a manner that it is arranged horizontally, and the interface Wa is bonded with ultrasonic vibration.

Figure 10:
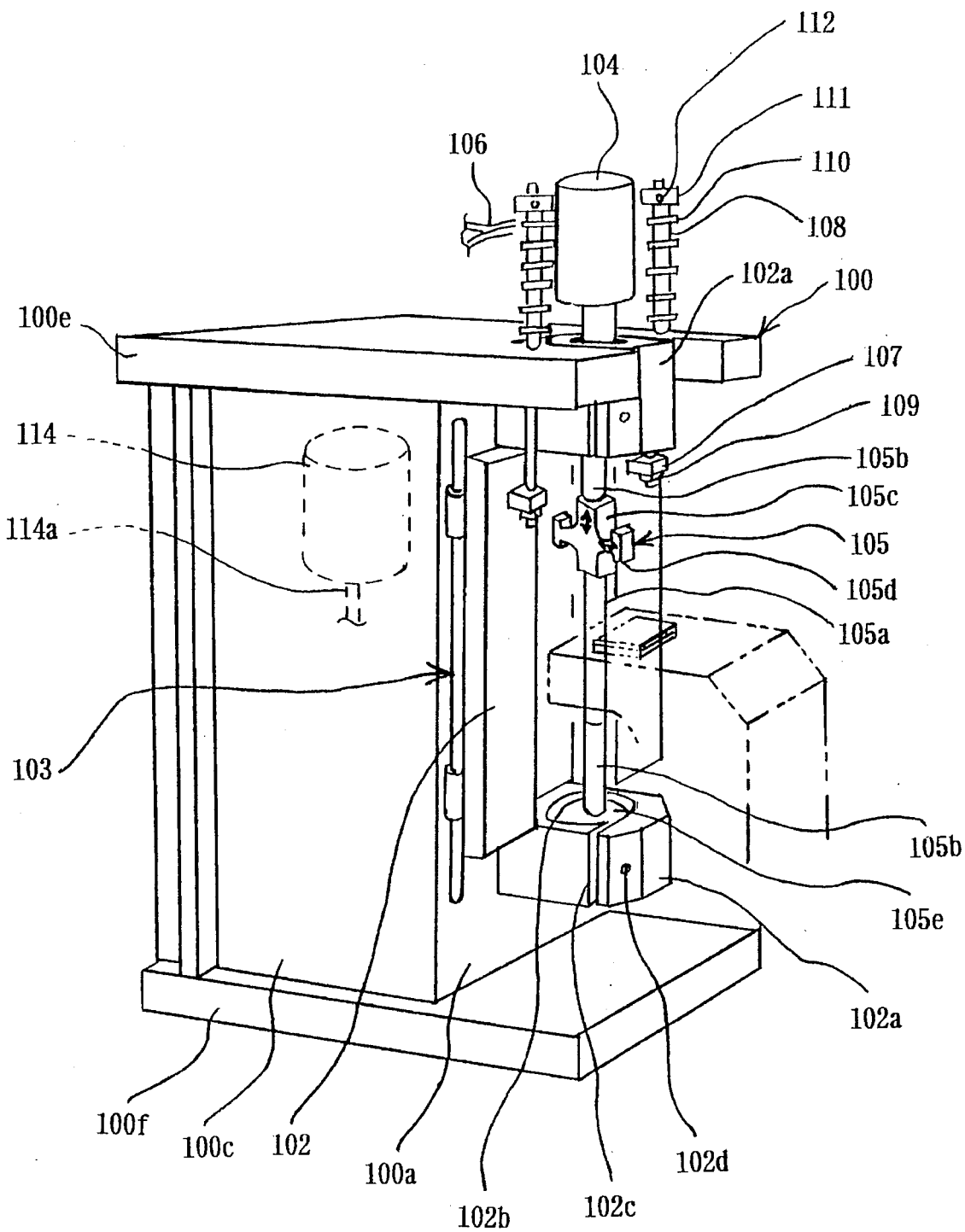
FIG. 10 is a perspective view showing the outer appearance of an ultrasonic bonding machine according to Embodiment 2 of the present invention.

FIG. 10 shows the outer appearance of an ultrasonic bonding machine in which a resonator is arranged vertically.

A holder 102 is installed in front of the front wall 100*a* of a main body 100 in such a manner that it can be moved vertically by a guide mechanism 103. This holder 102 holds at both ends the resonator 105, which is connected to the output end of a transducer 104 by means of an unshown screw and coaxial with the transducer 104, in such a manner that it is arranged vertically at the center thereof in a horizontal direction.

In this Embodiment, the transducer 104 is an so-called electro-acoustic converter or electric vibration converter for converting electric energy into mechanical energy and formed of a converse piezoelectric element, a magnetostriction element or the like, which generates and outputs vibration of a vertical ultrasonic wave having a predetermined frequency with electric energy received from an unshown ultrasonic wave generator through a cable 106. The resonator 105 is made of an alloy such as a titanium alloy having good acoustic characteristics and is bar-shaped to resonate with ultrasonic vibration output from the transducer and a predetermined resonance frequency. The resonator 105 comprises two boosters 105*b* connected to both ends in an axial direction of an ultrasonic horn 105*a* by means of unshown screws in such a manner that they are coaxial with the ultrasonic horn. The ultrasonic horn 105*a* has a cross-shaped vibration converter 105*c* and a bonding working portion 105*d* provided at an end portion in a horizontal direction of the cross of the vibration converter 105*c*. The two boosters 105*b* are connected to support portions 105*e* for holding the resonator 105 in such a manner that the resonator 105 is supported by the holder 102 at both ends.

Upper and lower holding portions 102*a* of the holder 102 has expanding slots 102*c* for changing the diameters of through holes 102*b* formed in a vertical direction for accepting the resonator 105 in such a manner that they are coaxial with the resonator 105 and screws 102*d* inserted into the holding portions 102 through the expanding slots 102*c* from the front of the holding portions 102*a*. The screws 102*d* are screwed from the front side of the main body 100 to reduce the diameters of the through holes 102*b* while the resonator 105 is installed in the holder 102 in a vertical direction through the through holes 102*b*. Thereby, the holder 102 holds the support portion 105*e* of the resonator 105 and supports the resonator 105 at both ends. When the resonator 105 is installed in the holder 102 and the vibration converter 105*c* cannot pass through the through holes 102*a*, the resonator 105 is disconnected from the transducer 104, for example, a lower end portion of the resonator 105 is inserted into the lower through hole 102*b* from the top to the bottom while an upper end portion of the resonator 105 is inserted into the upper through hole 102*b* from the bottom to the top, the transducer 104 is connected to the top end of the resonator 105 by an unshown screw, and the resonator 105 is held in the holder 102 at both ends by screwing the screws 102*d*.

The holder 102 has brackets 107 on right and left front surfaces thereof. A rod 108 is inserted in each of the brackets 107 from the bottom to the top and a collar 109 in contact with the bottom surface of the bracket 107 is fixed to a lower end of the rod 108 projecting downward from the bracket 107. A top end of the rod 108 projecting upward from the bracket 107 passes through the top wall 100*e* of the main body 100, an elastic member 110 such as a coil spring is provided around the rod 108 projecting upward from the upper wall 100*e* of the main body 100, and an unshown male screw is formed on the top end of the rod 108 projecting upward from an operation member 111. A portion of the rod 108 having the male screw is fitted with the operation member 111 having an unshown screw hole formed therein by engaging the male screw with a female screw formed in the screw hole. The bottom surface of the operation member 111 and the top surface of the upper wall 100*e* of the main body 100 hold the upper and lower ends of the elastic member 110, respectively. Particularly when pressure air for lifting is not provided from an unshown pressure air feed circuit to the air cylinder 114 to be described later, the above elastic member 110 prevents the holder 102 from falling by its weight and holds the holder 102 at the uppermost position. This operation member 111 has on its side a screw 112 which is screwed into the rod 108 to fix the operation member 111 to the rod 108 so that it cannot turn.

Figure 11:
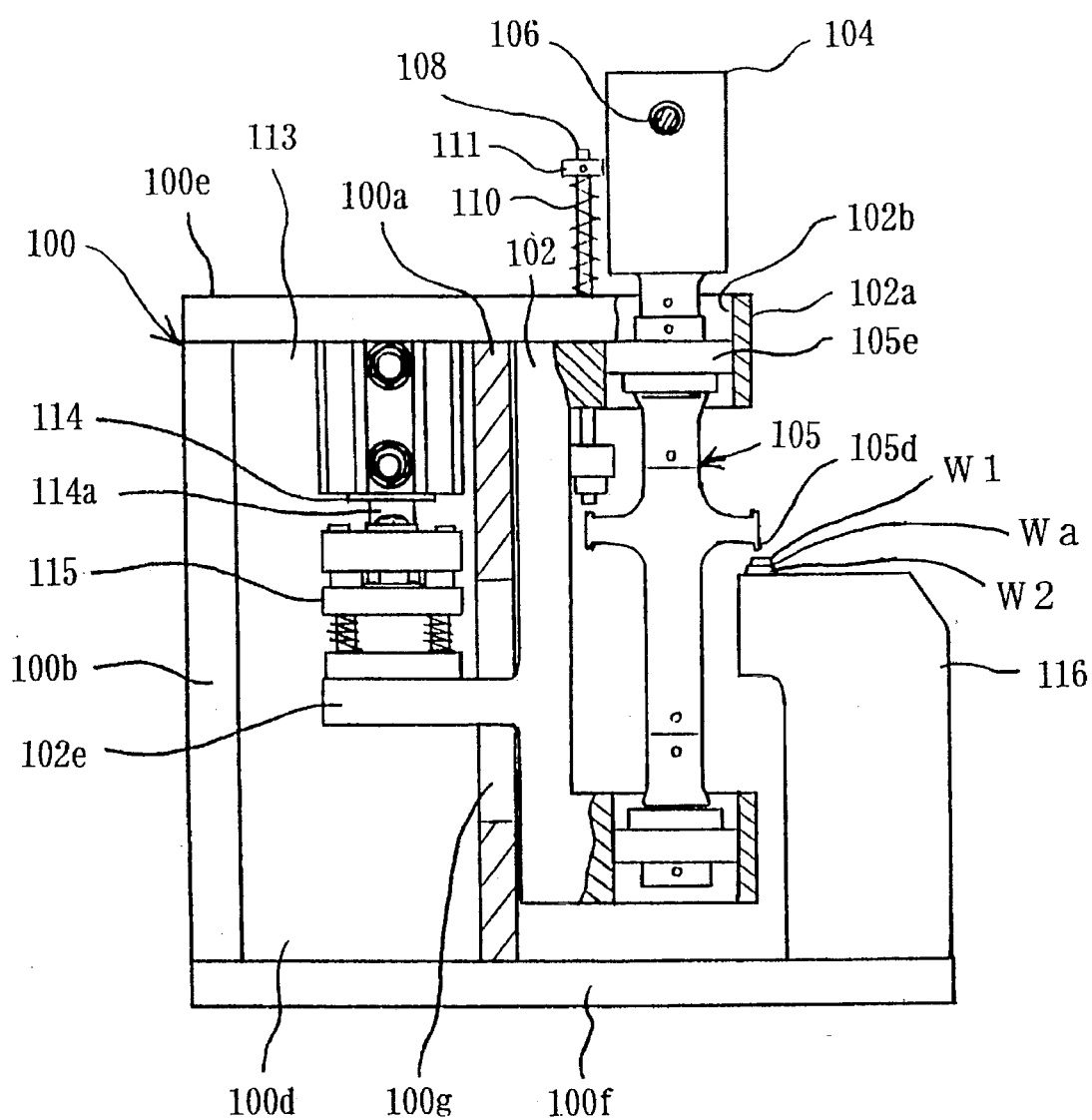
FIG. 11 is a partially cutaway side view of Embodiment 2.

FIG. 11 shows a drive system for moving the resonator vertically. The main body 100 has an inner space 113 surrounded by front, rear, right, left, top and bottom walls 100*a*, 100*b*, 100*c*, 100*d*, 100*e* and 100*f* and contains an air cylinder 114 in the inner space 113 as a pressure mechanism. The air cylinder 114 is installed on the top wall 100*e* of the main body 100 with its piston rod 114*a* facing downward. A relief hole 100*g* is formed in the front wall 100*a* of the main body 100 and an attachment portion 102*e* of the holder 102 which projects from the rear surface of the central portion thereof in a horizontal direction is inserted into the inside of the inner space 113 through this relief hole 100*g* from the front surface of the front wall 100*a*. The attachment portion 102*e* inserted into the inner space 113 is connected to a lower end of the piston rod 114*a* through a coupling mechanism 115, whereby the resonator 105 is held at both sides by the holder 102 in front of the front wall 100*a* of the main body 100 in such a manner that it is arranged vertically. A mount 116 installed on the bottom wall 100*f* extending forward from the front wall 100*a* of the main body 100 is arranged below the bonding working portion 105*d* located at a lower side of the forefront portion of the resonator 105 such that it faces the bonding working portion 105*d*.

Figure 12:
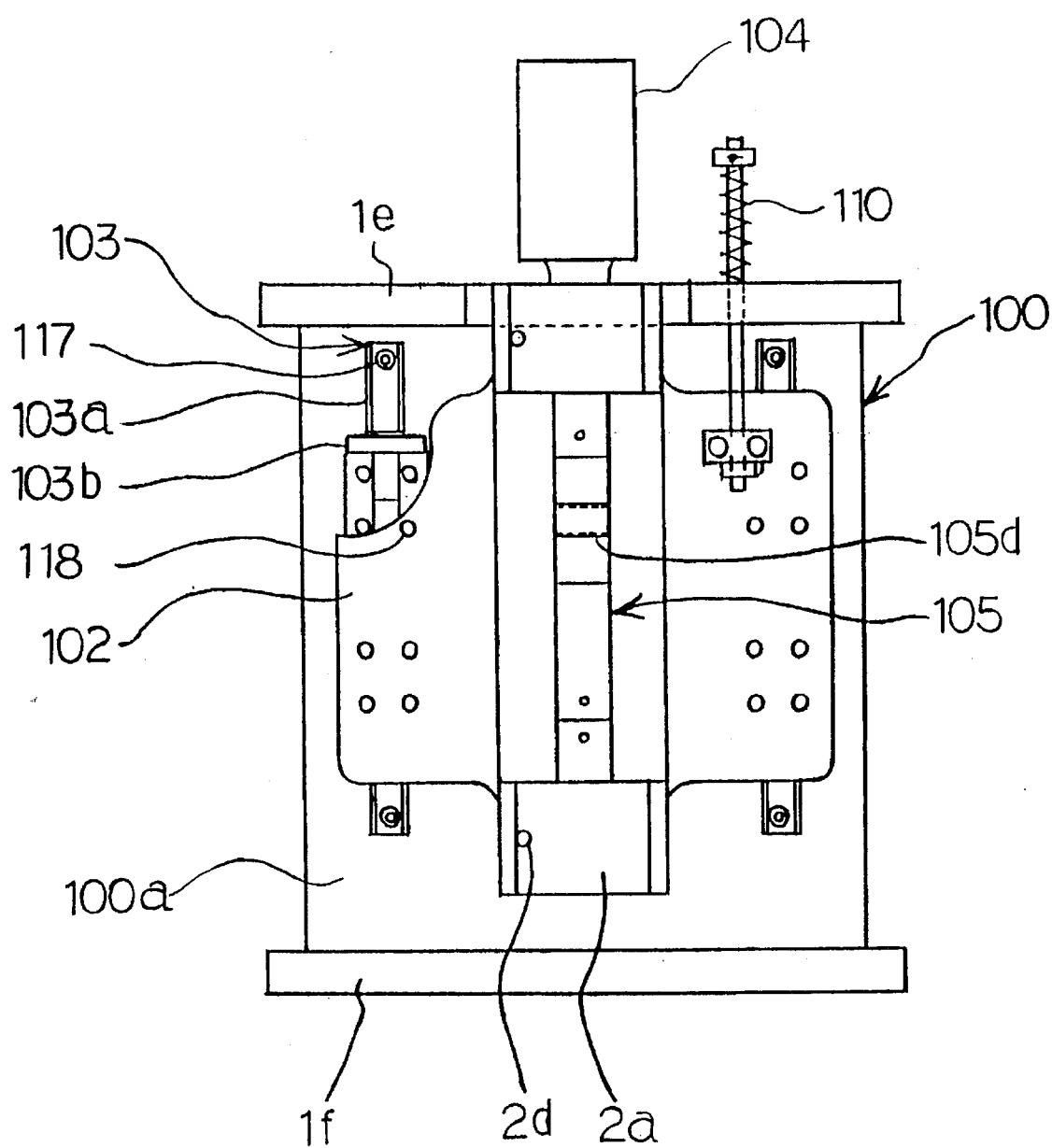
FIG. 12 is a front view of Embodiment 2.

FIG. 12 is a front view of the ultrasonic bonding machine with a partially cutaway holder. The guide mechanism 103 is provided on both right and left sides of the front surface of the front wall 100*a* of the main body 100 and consists of a guide rail 103*a* as a guide member attached to the front surface of the front wall 100*a* of the main body 100 by screws 117 and sliders 103*b* as a member to be guided which slide along the guide rail 103*a* in a vertical direction. In this Embodiment, two sliders 103*b* are provided for each guide rail 103*a* and are attached with screws 118 to the rear surface of the right and left walls of the holder 102 located on both right and left sides of the resonator 105.

Figure 13:
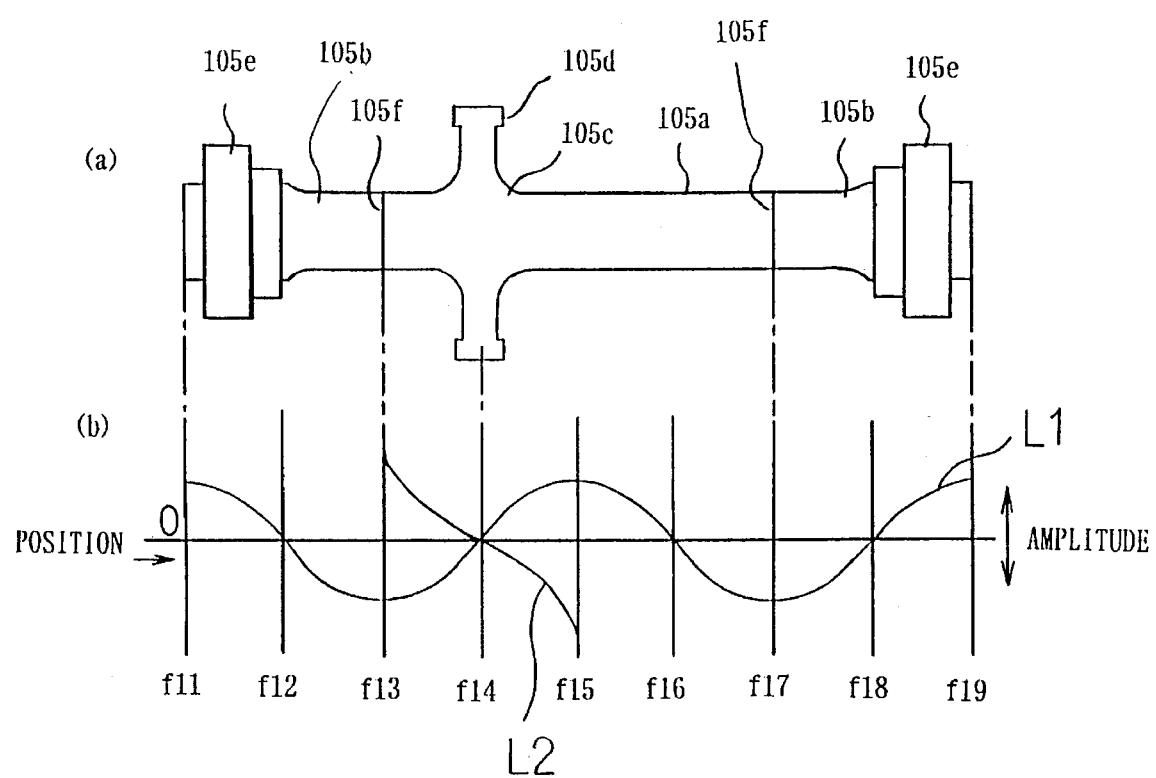
FIG. 13 shows the positional relationship between the transducer and ultrasonic vibration of Embodiment 2, (a) is a plan view of the transducer and the resonator and (b) is a waveform diagram of ultrasonic vibration.
Figure 14:
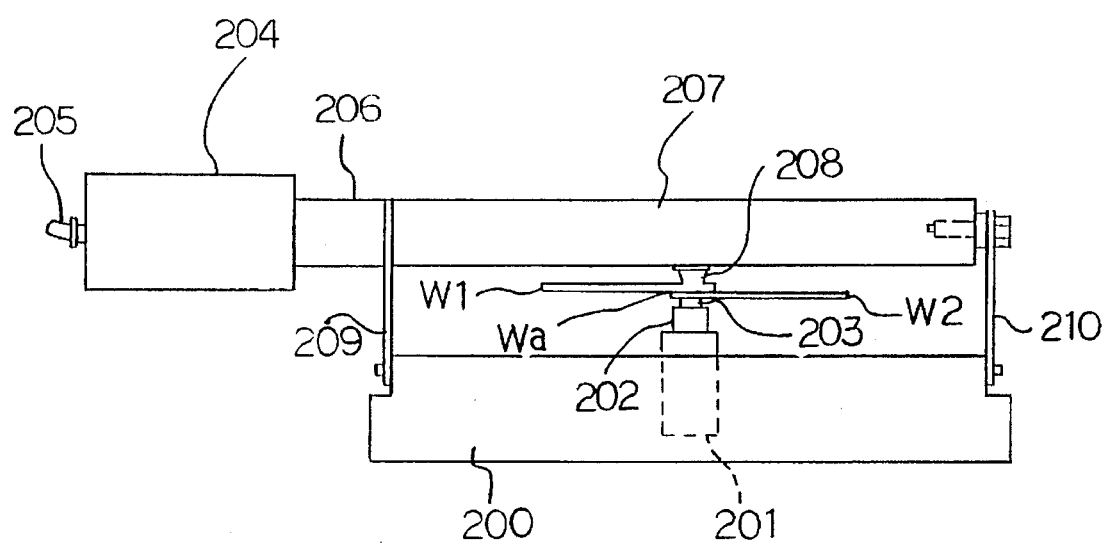
FIG. 14 is a side view of an ultrasonic bonding machine of the prior art.

FIG. 13 shows the relationship between the transducer and ultrasonic vibration. This resonator 105 is sized to provide five maximum vibration amplitude points f11, f13, f15, f17 and f19 and four minimum vibration amplitude points f12, f14, f16 and f18 at intermediate positions between the respective maximum vibration amplitude points when it resonates with ultrasonic vibration transmitted from the transducer 104 as a vertical wave and a predetermined frequency. That is, the total length of the resonator 105 is set to be equal to two times the wavelength of the resonance frequency.

In this Embodiment, the ultrasonic horn 105*a* has a length from the maximum vibration amplitude point f13 to the maximum vibration amplitude point f17 which is equal to one wavelength, and the vibration converter 105*c* is cross-shaped around the minimum vibration amplitude point f14 and converts ultrasonic vibration transmitted from the transducer 104 into a straight direction and its perpendicular direction. One of the boosters 105*b* has a length from the maximum vibration amplitude point f11 to the maximum vibration amplitude point f13 which is equal to half the wavelength, and the other one 105b has a length from the maximum vibration amplitude point f17 to the maximum vibration amplitude point f19 which is equal to half the wavelength. Two connection surfaces 105f between these boosters 105b and the ultrasonic horn 105a are located at the maximum vibration amplitude points f13 and f17. Instantaneous displacement of ultrasonic vibration generated by this resonator 105 is indicated by waveforms drawn by solid lines L1 and L2. The waveform drawn by the solid line L1 shows ultrasonic vibration transmitted from the transducer 104 and converted into a straight direction by the vibration converter 105c, and the waveform drawn by the solid line L2 shows ultrasonic vibration converted into the perpendicular direction by the vibration converter 105c.

Therefore, according to the constitution illustrated in FIGS. 10 to 13, due to the air feed route shifting operation of the unshown pressure air feed circuit, the piston rod 114a of the air cylinder 114 is activated to contract and the bonding working portion 105d is moved upward apart from the mount 116 a predetermined distance in a direction perpendicular to the transmission direction of ultrasonic vibration from the transducer 104 to the resonator 105. Thereafter, the piston rod 114a stops contraction and the bonding working portion 105d stops at the uppermost position, whereby a predetermined space for taking in and out the overlapped interface Wa is formed between the bottom surface of the bonding working portion 105d and the top surface of the mount 116. Under this condition, the overlapped interface Wa between the plurality of members W1 and W2 to be bonded together is placed in the bonding working area on the top surface of the mount 116 while they overlap each other.

Subsequently, during the period from the time when the piston rod 114a is activated to expand to the time when the piston rod 114a stops at the lowermost position due to the air feed route shifting operation of the pressure air feed circuit, the top surface of the interface Wa placed on top of the mount 116 is pressed against and brought in contact with the bottom surface of the bonding working portion 105d of the resonator 105, and the bottom surface of the interface Wa is pressed against and brought into contact with the top surface of the mount 116. As the result, the interface Wa is pressure-held between the mount 116 and the bonding working portion 105d.

At this time, since the resonator 105 and the air cylinder 114 are arranged lengthwise, the holder 102 is to be urged aslant in front and rear directions by reaction force exerted when the interface Wa is pressure-held by the bonding working portion 105d with the attachment portion 102e serving as a fulcrum. However, the reaction force is born by the front wall 100a of the main body 100 through the guide mechanism 103. Therefore, even if the holder 102 is made of a light metal such as aluminum, the holder 102 is not urged. As the result, parallelism between the bottom surface of the bonding working portion 105d and the top surface of the mount 116 is maintained and vibration energy is concentrated on the interface Wa, thereby stabilizing bonding strength.

Meanwhile, either after or before the interface Wa is pressure-held, electric energy is supplied from the unshown ultrasonic wave generator to the transducer 104 to cause the transducer 104 to generate ultrasonic vibration. The resonator 105 resonates with this ultrasonic vibration and the bonding working portion 105d vibrates with the maximum vibration amplitude in a direction perpendicular to the direction of pressurization by the air cylinder 114 to non-fusion bond the interface Wa.

After completion of bonding the interface Wa, during the period from the time when the air cylinder 114 is activated to contract to the time when the bonding working portion 105d moves from the lowermost position and stops at the uppermost position due to the air feed route shifting operation of the pressure air feed circuit, elastic force of the elastic member 110 which tries to expand therewith acts on the holder 102 and assists the upward movement of the air cylinder 114 while supply of electric energy from the unshown ultrasonic wave generator to the transducer 104 is stopped. Therefore, even if pressure for moving the air cylinder 114 upward is not so high, the initial upward movement of the air cylinder 114 is accelerated and the bonding working portion 105d parts from the interface Wa instantaneously, thereby shortening the lifting time.

Finally, after pressure-holding of the interface Wa between the bonding working portion 105d and the mount 116 is released, the top surface of the mount 116 and the bottom surface of the bonding working portion 105d part instantaneously from the interface Wa which has been bonded, the plurality of members W1 and W2 which have been joined together through the bonded interface Wa are taken out from the predetermined space formed between the mount 116 and the bonding working portion 105d, thereby completing the bonding step.

In the above Embodiment, the ultrasonic horn 105a having a length equal to one wavelength has been illustrated, but it may be shaped to have a length from the maximum vibration amplitude point f13 to the maximum vibration amplitude point f15 shown in FIG. 13 which is equal to half the wavelength and the boosters 105b may be connected to both ends of the ultrasonic horn 105a by screws separately in such a manner that they are coaxial with the ultrasonic horn 105a, whereby the resonator 105 is sized to have a length equal to ¾ the wavelength.

In the above Embodiment, the resonator 105 is directly connected to the output end of the transducer 104. However, it is possible to change vibration amplitude at the bonding working portion 105d by using an intermediate booster between the resonator 105 and the transducer 104. The intermediate booster has a length equal to multiples of a half of the wavelength, is made of a material selected from titanium, aluminum and hardened iron, for example, and is structured such that the input/output ratio (magnification) of vibration amplitude is changed by the volume ratio of its rod-shaped large-diameter portion to its rod-shaped small-diameter portion.

What is claimed is:

1. An ultrasonic bonding machine for bonding an overlapped interface between a plurality of members to be bonded together with vibration of a vertical ultrasonic wave, the ultrasonic bonding machine comprising:
   a main body in which a working space open in forward, right and left directions is formed;
   a mount, located in a lower portion of the working space, for mounting the interface;
   a transducer for generating the ultrasonic vibration;
   a resonator, connected to the output end of the transducer, which resonates with ultrasonic vibration from the transducer and a predetermined resonance frequency and has bonding working portions projecting from the outside surface thereof and support portions projecting from the outside surface thereof at positions apart from the bonding working portions and on both sides of the bonding working portions;

a pressure mechanism which is installed inside a portion of the main body for defining an upper portion of the working space so as to form a space for taking in and out the interface between the mount and the bonding working portion by moving up the resonator connected to the transducer a predetermined distance in a direction perpendicular to the transmission direction of ultrasonic vibration from the transducer to the resonator so that the resonator parts from the mount and to pressure-hold the interface between the mount and the bonding working portion by moving down the resonator connected to the transducer a predetermined distance in a direction perpendicular to the transmission direction of ultrasonic vibration from the transducer to the resonator so that the resonator approaches the mount; and a support member, connected to the output end of the pressure mechanism, for supporting the resonator at both ends through support portions thereof in such a manner that it is arranged horizontally in the working space above the mount.

2. An ultrasonic bonding machine for bonding an overlapped interface between a plurality of members to be bonded together with vibration of a vertical ultrasonic wave, wherein a pressure mechanism for moving vertically is arranged inside a main body, a resonator which resonates with ultrasonic vibration and a predetermined resonance frequency and has a bonding working portion and support portions at positions apart from the bonding working portion in the transmission direction of ultrasonic vibration is connected to the output end of a transducer for generating ultrasonic vibration and held by a holding member at both ends through support portions thereof, the overlapped interface between the plurality of members to be bonded together is pressure-held between the bonding working portion of the resonator and the mount by connecting the holding member to the output end of the pressure mechanism and moving the resonator with the pressure mechanism a predetermined distance in a direction that the resonator approaches the mount arranged to face the bonding working portion thereof, ultrasonic vibration is transmitted from the transducer to the bonding working portion of the resonator to bond the interface, a cross-shaped vibration converter is provided at the minimum vibration amplitude point of ultrasonic vibration transmitted from the transducer to the resonator, the bonding working portion is provided at an end portion, in a horizontal direction, of the cross of the vibration converter, the resonator is held by a holding member at both ends through support portions thereof in such a manner that it is arranged vertically at the front of a main body, a plurality of guide members are provided on the front surface of the main body in such a manner that they are parallel to each other in a horizontal direction with a predetermined space formed therebetween, and members to be guided which slide along the guide members are provided on the rear surface of the holding member.

3. A resonator for use in an ultrasonic bonding machine for bonding an overlapped interface between a plurality of members to be bonded together with vibration of a vertical ultrasonic wave, which resonates with ultrasonic vibration from a transducer and a predetermined resonance frequency, has bonding working portions projecting from the outside surface thereof and support portions projecting from the outside surface thereof at positions equally apart from the bonding working portions and on both side of the bonding working portions, and consists of at least three parts, an ultrasonic horn having the bonding working portions and two boosters having the support portions which are connected to both ends of the ultrasonic horn by means of screws in such a manner that they are coaxial with the ultrasonic horn.

* * * * *